United States Patent [19]

Foell et al.

[11] Patent Number: 4,557,793

[45] Date of Patent: Dec. 10, 1985

[54] METHOD AND APPARATUS FOR DRAWING CRYSTALLINE BODIES FROM A MELT

[75] Inventors: Helmut Foell, Munich; Josef Grabmaier, Berg; Juergen Schneider, Baldham, all of Fed. Rep. of Germany

[73] Assignee: Siemens Aktiengesellschaft, Berlin & Munich, Fed. Rep. of Germany

[21] Appl. No.: 573,729

[22] Filed: Jan. 25, 1984

[30] Foreign Application Priority Data

Mar. 24, 1983 [DE] Fed. Rep. of Germany ....... 3310815

[51] Int. Cl.[4] ........................................... C30B 15/34
[52] U.S. Cl. ................................. 156/608; 422/246
[58] Field of Search ............... 422/246, 240; 156/608, 156/DIG. 83

[56] References Cited

U.S. PATENT DOCUMENTS

| | | | |
|---|---|---|---|
| 4,075,055 | 2/1978 | Ciszek et al. | 156/608 |
| 4,211,600 | 7/1980 | Cole | 156/608 |
| 4,268,483 | 5/1981 | Davey et al. | 156/DIG. 83 |
| 4,325,917 | 4/1982 | Pets et al. | 156/608 |
| 4,353,757 | 10/1982 | Kalejs et al. | 156/608 |

OTHER PUBLICATIONS

Bulletin of the Academy of Sciences of the USSR—Physical Series No. 12, vol. 33, 1969, pp. 1775–1782, "Transactions of the Second Conference on Producing Semiconductor Single Crystals by Stepanov's Method and on Prospects for their Use in the Instrument Making Industry", (Leningrad, Apr. 10-12, 1968).

*Primary Examiner*—Hiram H. Bernstein
*Attorney, Agent, or Firm*—Hill, Van Santen, Steadman & Simpson

[57] ABSTRACT

This invention involves a method and apparatus for drawing crystalline bodies from a melt by means of an open-ended drawing nozzle which determines the cross-sectional geometry of the crystalline body. The drawing nozzle is composed of a material which is resistant to the melt. The feed of melt proceeds from a reservoir situated at the lower end of the drawing nozzle and the melt is conveyed to the upper opening thereof by capillary action. In keeping with the present invention, there is provided a drawing nozzle which has an upper opening merging into a contoured surface such that the meniscus formed at the interface between the crystalline and molten phases is freely displaceable on the contoured surface into which the upper opening discharges.

8 Claims, 5 Drawing Figures

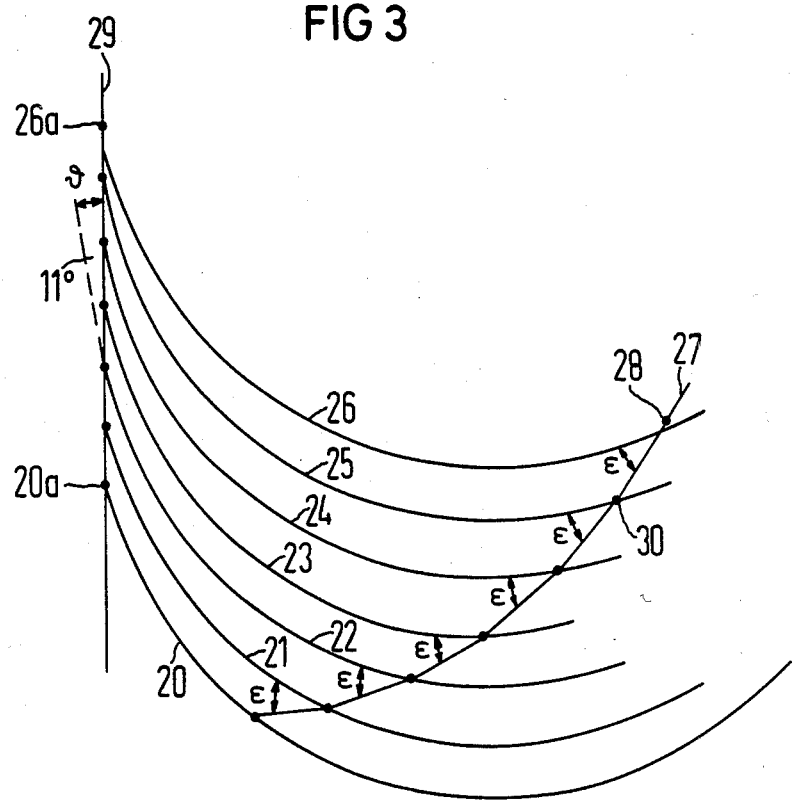

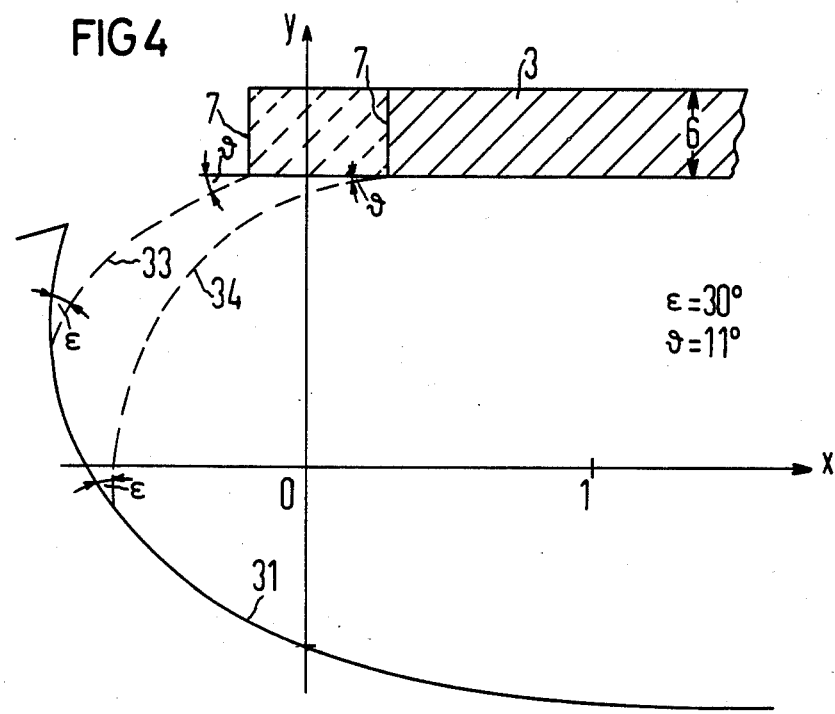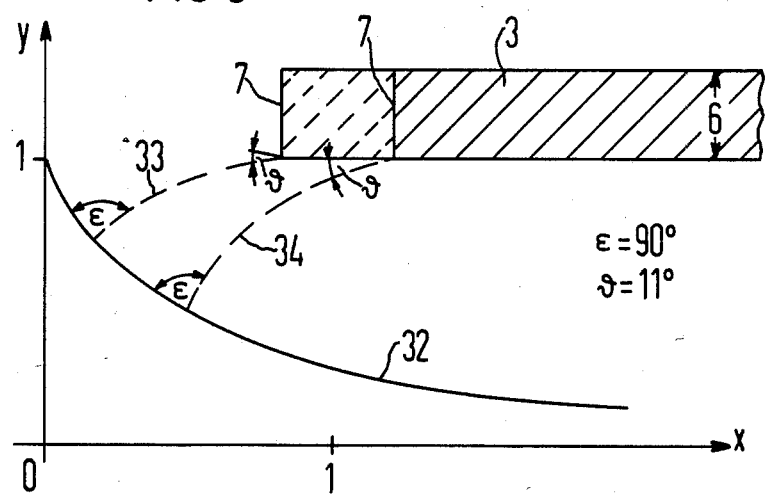

METHOD AND APPARATUS FOR DRAWING CRYSTALLINE BODIES FROM A MELT

BACKGROUND OF THE INVENTION

1. Field of the Invention

This invention is in the field of drawing crystalline bodies from a semiconductor melt using shaping parts which define the cross-sectional geometry of the crystalline body to be drawn. The shaping parts include a drawing nozzle which is inserted into the melt, whereby the feed of melt proceeds from a melt supply situated at the lower opening of the drawing nozzle, and is conveyed to the upper opening of the drawing nozzle due to capillary action.

2. Description of the Prior Art

The growth of crystals having a required cross-sectional shape such as tapes, tubes, threads and the like can only be accomplished upon employing shaping parts that function as drawing nozzles. One such method is known as the Stepanov process and is disclosed in the Bulletin of the Academy of Sciences of the USSR, Physical Series, No. 12, Vol. 33, 1969, pages 1775–1782 under the title "Transactions of the Second Conference on Producing Semiconductor Single Crystals by Stepanov's Method and on Prospects for Their Use in the Instrument-Making Industry".

The drawing of sillicon tapes for the purposes of solar cells, for example, can be carried out according to this method. To carry out the method, molten silicon is supplied in the gap of a drawing nozzle from a silicon reservoir. The melt meniscus is limited by the growing silicon crystal on the one hand and by an edge of the drawing nozzle lip on the other. The crystal growth thus becomes "edge-defined". The cross-sectional geometry of the crystal, particularly the thickness of the growing crystal tape, is thereby determined by the geometry of the drawing nozzle and by the distance between the crystallization front and the drawing nozzle, referred to as the meniscus height. Since the meniscus height can fluctuate within a certain range by reason of, for example, thermal disruptions, the cross-sectional shape of the growing crystal is thereby subject to fluctuations, although fundamentally defined by the geometry of the drawing nozzle. These fluctuations area unavoidable since maintaining the cross-sectional geometry of the crystal constant with fluctuations of the meniscus height is not possible with the edge-defined Stepanov process.

A further edge-defined growth process for crystalline bodies with predetermined cross section from the melt is known from DE-AS No. 19 35 372. Arbitrarily profiled crystalline bodies such as threads, tapes or tubes can be produced with this method by employing suitably shaped parts. The shaping parts consist of a material which can be moistened by the melt, and are equipped with capillary passages for the feed of the melt. They exhibit a horizontal, upper end surface on which a melt film can spread up to the sharp edges, the crystalline body being drawn from the melt film. The edge-limited, horizontal, upper end surface of the shaping part corresponds to the predetermined cross-sectional area of the crystalline body to be drawn. Due to fluctuations in the meniscus height, it is also difficult to keep the cross-sectional geometry of the crystal constant with this method.

SUMMARY OF THE INVENTION

The present invention provides a drawing nozzle which allows a prescribed, functional interrelationshp between the meniscus height and the cross-sectional dimension to be achieved. The non-variation of the cross-sectional shape in comparison to fluctuations in meniscus height is a particular feature of the present invention.

The objectives of the present invention are achieved by employing a drawing nozzle which is designed to cooperate with a contoured surface at its discharge end such that the meniscus formed at the interface between the molten and crystalline phases is freely displaceable on the contoured surface into which the upper opening of the drawing nozzle discharges. As a result of this design, the meniscus is no longer anchored at an edge but can freely shift on the surface of the contoured surface and any desired relationship between the meniscus height and the cross-sectional geometry can be achieved. In a particularly preferred form of the present invention, there is provided a drawing nozzle for manufacturing crystalline bodies of constant thickness independent of meniscus height whose end surface profile is defined as a subsection of the curve defined by the equation:

$$x = \cos \psi + \sin \epsilon \cdot \ln \frac{1 + \sin (\psi + \epsilon)}{\cos (\psi + \epsilon)}$$

where
$\epsilon$ = wetting angle of the melt with respect to the drawing nozzle material
$\psi$ = arc sin y
meniscus radius = 1 and
x and y are Cartesian coordinates.

The preferred nozzle materials are graphite and quartz where the crystal bodies are composed of semiconductor material such as silicon or germanium.

BRIEF DESCRIPTION OF THE DRAWINGS

FIG. 3 is a chart illustrating the principles of graphic design for the contoured upper drawing nozzle surface;

FIG. 4 is a graph resulting from the analytical calculation in accordance with the equation used in the present invention, on a graphite drawing nozzle; and FIG. 5 is a graph similar to that of FIG. 4 but employing a quartz drawing nozzle.

DESCRIPTION OF THE PREFERRED EMBODIMENTS

Figure 1:
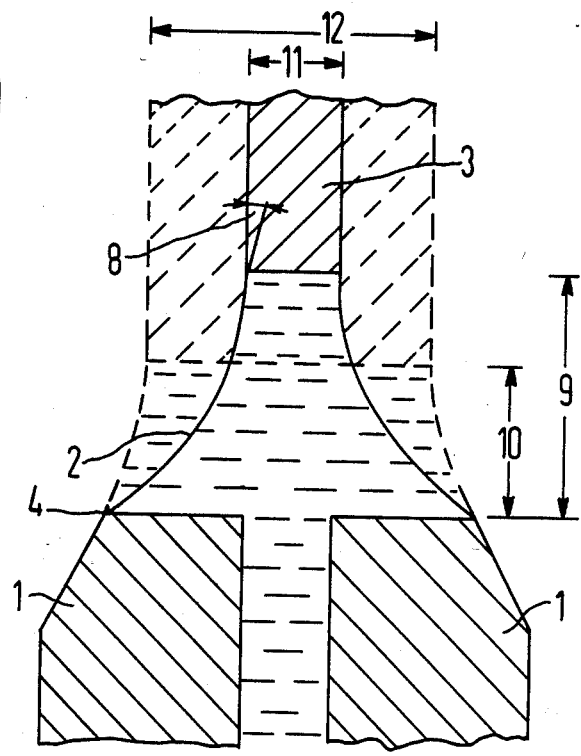
FIG. 1 is a fragmentary cross-sectional view, greatly enlarged, showing the relationship at the phase boundary surface between liquid and solid with a conventional drawing nozzle of the prior art.

Turning first to the prior art, in FIG. 1 there is shown a conventional drawing nozzle 1 with an edge-defined meniscus 2,4. It will be evident that a change in the meniscus height from position 9 to position 10 results in a change in thickness of the growing crystal 3 from a thickness 11 to a thickness 12. The geometry of the meniscus 2 and the crystal 3 with stationary crystal growth is determined by three equilibrium conditions:

1. The convergence angle of the meniscus 2 into the crystal 3 must correspond to the wetting angle illustrated at reference numeral 8.
2. The meniscus shape is given by the corresponding solution of the Poisson equation.
3. The meniscus 2 is limited by the edge 4 of the drawing nozzle 1.

Figure 2:
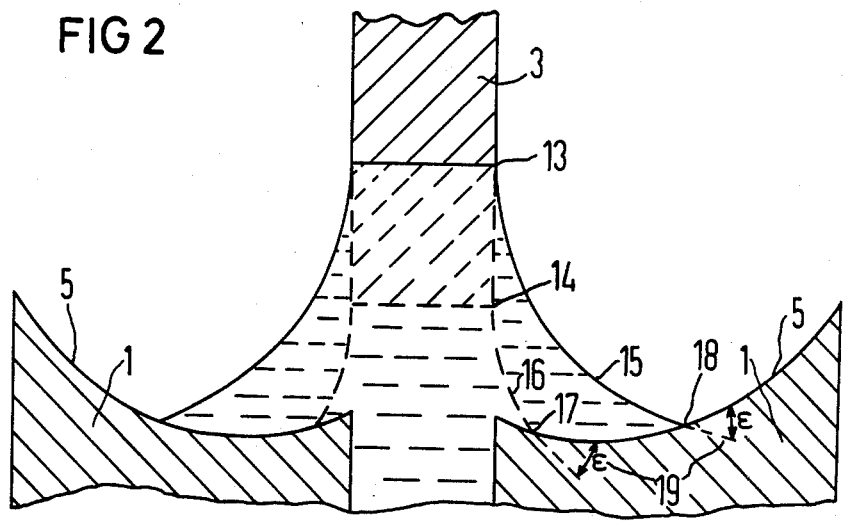
FIG. 2 is a view similar to FIG. 1 but illustrating the conditions existing when the improved discharge nozzle of the present invention is employed.

The improved drawing nozzle structure of the present invention is illustrated in FIG. 2. Two possible meniscus heights represented at reference numerals 13 and 14 are indicated together with the appropriate menisci 15 and 16, respectively. End points 17, 18 of the meniscus are no longer defined by an edge of the drawing nozzle as in FIG. 1 but can shift on the discharge lip surface 5 until it again contacts onto the surface of the discharge lip with a wetting angle $\epsilon$, identified at reference numeral 19 in FIG. 2, which is typical of the equilibrium situation. In case the discharge lip 1,5, has a very specific shape, the thickness of the growing crystal 3 remains constant despite a change in the meniscus height. Typical examples, for example, are 0.2 mm for the thickness of the growing crystal 3, 1-2 mm for the meniscus radii, and about 0.2 to 0.5 mm for the width of the discharge lip 1,5. The remaining dimensions of the drawing nozzle can be determined from FIGS. 4 and 5.

The determination of the discharge lip shape 1,5, in FIG. 2 can be done analytically or graphically. The following assumptions have been made for the purpose of simplification and without restricting the universal applicability:
1. The problem is two-dimensional, i.e., the crystal dimension does not change perpendicular to the plane of the drawing in FIGS. 1 and 2.
2. The local radius of curvature is constant, i.e., the mensicus cross section is a segment of a circle.
3. The meniscus is freely displaceable on the surface of the discharge lip 1,5 without frictional effects, i.e., without hysteresis of the wetting angle $\epsilon$.

The first and second assumptions represent good approximations when, for example, drawing crystal tapes from nozzles wherein the discharge lips lie a few centimeters above the melt level of a reservoir coupled to the drawing nozzle by means of capillaries.

FIG. 3 shows the principle of a graphic construction of the discharge lip shape wherein the thickness of the growing crystal 3 does not change as the meniscus height fluctuates. The line 29 symbolizes one surface of the growing crystal. The curves 20 to 26 are possible menisci that are merged into the growing cyrstal between the points 20a and 26a. The wetting angle $\theta$ between the crystal and the melt is assumed to be 11° which is the case, for example, with silicon. The construction of the discharge lip shape 27 begins at an arbitrary location, for example, at point 28. A straight line is drawn, intersecting the meniscus 26 and proceeding through point 28 at the wetting angle $\epsilon$. This wetting angle is 30° in FIG. 3, representing the case of a silicon melt and a graphite drawing nozzle. This straight line obtained intersects the neighboring meniscus line 25 at a point 30. A new straight line is then drawn through point 30 intersecting the meniscus angle at the angle $\epsilon$. A more frequent repetition of this procedure yields an approximation to the sought-after discharge lip shape.

The line curve 27 can be obtained with any desired precision by means of known graphic methods. An algorithm for computer programming in complicated cases follows from the graphic construction. The line 29 is first replaced by a curve that indicates the desired crystal thickness and meniscus height. The respective meniscus shape is then calculated for the meniscus points 26a, and so on. These points can be calculated by solving the Poisson equation. The menisci thereby obtained, corresponding to curves 26-20 in FIG. 3, can then be utilized for the construction of the discharge lip shape in the manner already discussed.

The discharge lip shape can also be analytically calculated in simple cases by means of a differential equation. For example, the discharge lip shape in the case discussed above is represented by the function:

$$x = \cos \psi + \sin \epsilon \cdot \ln \frac{1 + \sin(\psi + \epsilon)}{\cos(\psi + \epsilon)}$$

where $\epsilon$ = wetting angle of the melt with respect to the drawing nozzle material
$\psi$ = arc sin y
meiscus radius = 1 and
x and y are Cartesian coordinates.

Two graphs of the aforementioned function for $\epsilon = 30°$ (a silicon melt with graphite as the lip material) are shown in FIG. 4 and FIG. 5. FIG. 5 represents the same condition for $\epsilon = 90°$ (silicon melt with quartz as the lip material). One branch of the functions is shown in each curve. The graphs obtained due to mirroring at the x-axis and y-axis as well as trivial solutions (straight lines) of the above equations have been omitted. The curves 31 and 32 represent the respective discharge lip shapes. The curves 33 and 34 show two possible menisci. The drawn crystal is again referred to at reference numeral 3, the crystallization front at reference numeral 7, and the crystal thickness at reference numeral 6.

The method of the present invention is suited to all crystal drawing methods wherein a drawing nozzle is employed, for example, for drawing germanium or sapphire tapes in addition to drawing silicon tapes. They can also be used for differently profiled crystal bodies such, for example, as tubes, hexagonal or quadrangular crystals or for thin crystal threads.

It is important for the application of the invention that suitable drawing nozzle materials be available for a specific type of crystal.

It will be evident that various modifications can be made to the described embodiments without departing from the scope of the present invention.

We claim as our invention:
1. In a method for drawing crystalline bodies from a melt by means of an open-ended drawing nozzle which determines the cross-sectional geometry of the crystalline body to be drawn, said drawing nozzle being composed of material resistant to said melt, the feed of melt proceeding from a reservoir situated at the lower end of said drawing nozzle and being conveyed to the upper opening thereof by capillary action, the improvement which comprises:
   employing a drawing nozzle having an upper opening merging into a contoured surface such that the meniscus formed at the interface between the crystalline and molten phases is freely displaceable on said contoured surface into which said upper opening discharges, the contoured surface having a contour defined by the equation:

$$x = \cos \psi + \sin \epsilon \cdot \ln \frac{1 + \sin(\psi + \epsilon)}{\cos(\psi + \epsilon)}$$

where:
ε is the wetting angle of the melt with respect to the material of the drawing nozzle
ψ is arc sin y
meniscus radius=1, and
x and y are Cartesian coordinates.

2. A method according to claim 1 wherein said drawing nozzle consists of graphite or quartz.

3. A method according to claim 2 wherein said crystalline material is silicon or germanium.

4. A method according to claim 3 wherein the meniscus radii are in the range from 1 to 2 mm, the width of said contoured surface is from 0.2 to 0.5 mm, and the drawing nozzle is conformed to produce a tape of about 0.2 mm thickness.

5. The use of the method of claim 1 in producing crystalline bodies of tapes, threads, tubes or polygonal crystals.

6. An apparatus for drawing crystalline bodies which comprises:
- a reservoir for holding molten semiconductor material,
- a drawing nozzle having a lower end communicating with said reservoir and an upper discharge end into which said molten material flows by capillarity,
- said upper discharge end merging into a contoured surface laterally thereof,
- said contoured surface being defined by the equation:

$$x = \cos \psi + \sin \epsilon \cdot \ln \frac{1 + \sin(\psi + \epsilon)}{\cos(\psi + \epsilon)}$$

where ε=wetting angle of the melt with respect to the drawing nozzle material
ψ=arc sin y
meniscus radius=1 and
x and y are Cartesian coordinates.

7. The apparatus of claim 6 in which said drawing nozzle is composed of graphite.

8. The apparatus of claim 6 in which said drawing nozzle is composed of quartz.

* * * * *